United States Patent
Lee et al.

(10) Patent No.: US 7,074,722 B2
(45) Date of Patent: *Jul. 11, 2006

(54) METHOD FOR FABRICATING SEMICONDUCTOR DEVICE WITH FINE PATTERN

(75) Inventors: Min-Suk Lee, Ichon-shi (KR); Sung-Kwon Lee, Ichon-shi (KR)

(73) Assignee: Hynix Semiconductor Inc. (KR)

(*) Notice: Subject to any disclaimer, the term of this patent is extended or adjusted under 35 U.S.C. 154(b) by 185 days.

This patent is subject to a terminal disclaimer.

(21) Appl. No.: 10/748,613

(22) Filed: Dec. 29, 2003

(65) Prior Publication Data

US 2005/0090117 A1    Apr. 28, 2005

(30) Foreign Application Priority Data

Oct. 23, 2003    (KR)    ............ 10-2003-0074175

(51) Int. Cl.
*H01L 21/302*    (2006.01)

(52) U.S. Cl. .............. 438/706; 438/618; 438/637; 438/610

(58) Field of Classification Search ........ 438/229, 438/256, 637, 706, 710, 712, 614, 618
See application file for complete search history.

(56) References Cited

U.S. PATENT DOCUMENTS

| 6,265,296 | B1 | 7/2001 | Yen et al. | |
| 6,475,906 | B1* | 11/2002 | Lee | 438/637 |
| 2003/0066545 | A1* | 4/2003 | Chang et al. | 134/19 |
| 2004/0038546 | A1* | 2/2004 | Ko | 438/710 |
| 2005/0090055 | A1* | 4/2005 | Lee et al. | 438/256 |

FOREIGN PATENT DOCUMENTS

KR    1020000014605 A    3/2000

* cited by examiner

*Primary Examiner*—Lan Vinh
(74) *Attorney, Agent, or Firm*—Blakely, Sokoloff, Taylor & Zafman

(57) ABSTRACT

The present invention relates to a method for fabricating a semiconductor device with a fine pattern. The method includes the steps of: (a) forming a semiconductor substrate structure including a substrate, a nitride layer for forming a hard mask, a plurality of conductive patterns, an etch stop layer, an inter-layer insulation layer, an anti-reflective coating (ARC) layer and a photoresist pattern; (b) selectively etching the ARC layer and the nitride layer with use of the photoresist pattern as an etch mask to form a hard mask; (c) removing the photoresist pattern and the ARC layer; (d) etching the inter-layer insulation layer disposed between the conductive patterns by using the hard mask as an etch mask to form a contact hole exposing the etch stop layer; (e) removing the etch stop layer formed at a bottom area of the contact hole to expose the substrate; and (f) forming a plug electrically contacted to the exposed substrate, wherein the steps (b) and (d) to (e) proceeds in an in situ condition.

25 Claims, 13 Drawing Sheets

METHOD FOR FABRICATING SEMICONDUCTOR DEVICE WITH FINE PATTERN

FIELD OF THE INVENTION

The present invention relates to a method for fabricating a semiconductor device; and, more particularly, to a method for fabricating a semiconductor device with a fine pattern by employing an ArF photolithography.

DESCRIPTION OF RELATED ARTS

Because of large scale of integration, it is necessary to densely form semiconductor devices within a limited cell area. Thus, the size of unit devices such as a transistor and a capacitor has been progressively decreased. Particularly, in a dynamic random access memory (DRAM) device, a current trend of the design rule in micronization has led the size of the semiconductor devices formed within the limited cell area to be gradually decreased as well. For instance, the minimum linewidth of a currently developed DRAM device is lower than about 0.1 µm, and in some cases, the required minimum linewidth is lower than about 80 nm. Hence, there arise many difficulties in fabricating semiconductor devices within the limited cell area.

Particularly, in a semiconductor device having a linewidth lower than about 80 nm, if a photolithography process using a light source of ArF having the wavelength of about 193 nm is employed, a photoresist may be deformed in the course of performing a conventional etching process for forming a conformal pattern with a vertical etch profile. Thus, it is additionally required to suppress the pattern deformation phenomenon. For this reason, it is mainly focused to develop a process that simultaneously satisfies conditions of the typical etching process and the additional requirement for suppressing the pattern deformation.

Meanwhile, as the level of integration of the semiconductor device has been accelerated, various device elements are formed in a stack structure, and thus, a contact plug or a contact pad is adopted for the stack structure.

For the above mentioned contact plug or the contact pad, a landing plug contact is typically used because of its advantage. That is, at a bottom part of the landing plug contact, a maximum contact area can be secured within a limited area and an upper part of the landing plug contact is larger than the bottom part to increase process margins for subsequent processes.

FIGS. 1A to 1D are cross-sectional views illustrating a method for forming a conventional landing plug contact.

Referring to FIG. 1A, a plurality of gate electrode patterns G1 and G2 are formed on a substrate 10 providing various elements such as a field insulation layer and a well. Herein, each gate electrode pattern G1 or G2 has a stack structure of a gate hard mask 13, a gate conductive layer 12 and a gate insulation layer 11.

The gate insulation layer 11 is typically made of an oxide-based material, while the gate conductive layer 12 is made of one polysilicon, tungsten (w), tungsten nitride (WN), tungsten silicide ($WSi_x$) and any combination of these listed materials.

The gate hard mask 13 serves to protect the gate conductive layer 12 in the course of forming a contact hole by etching an inter-layer insulation layer, which will be subsequently formed, and thus, the gate hard mask 13 is made of a material providing etch selectivity different from that of the inter-layer insulation layer. For instance, if the inter-layer insulation layer is made of an oxide-based material, the gate hard mask 13 is made of a nitride-based material such as silicon nitride (SiN) or silicon oxynitride (SiON). If the inter-layer insulation layer is made of a polymer-based material having a low dielectric coefficient, then, the gate hard mask 13 is made of an oxide-based material.

Generally, in case that an impurity diffusion region 14, e.g., a source/drain junction region, is formed in between the gate electrode patterns G1 and G2 through the use of an ion-implantation, the impurity diffusion region 14 is self-aligned to the gate electrodes G1 and G2, and then, an impurity is ion-implanted to the substrate 10. Thereafter, a spacer is formed on sidewalls of each gate electrode patterns G1 and G2. Then, another ion-implantation is performed to form a lightly doped drain (LDD) structure. Herein, detailed descriptions on processes for forming the LDD structure and the spacer are omitted.

An etch stop layer 15 is formed along a profile containing the gate electrode patterns G1 and G2. Herein, the etch stop layer 15 serves to stop a self-aligned contact (SAC) etching at a certain point so as to prevent the substrate 10 from being attacked during the SAC etching process.

Referring to FIG. 1B, an inter-layer insulation layer 16 made of an oxide-based material is deposited on an entire surface of the above structure. Such materials as borosilicate glass (BSG), borophosphosilicate glass (BPSG), phosphosilicate glass (PSG), tetraethylorthosilicate (TEOS), high density plasma (HDP) oxide and spin-on-glass (SOG) can be used for the inter-layer insulation layer 16. Also, the inter-layer insulation layer 16 can be also made of an organic or inorganic material.

Next, a photoresist pattern 17 for forming a landing plug contact is formed on the inter-layer insulation layer 16. Typically, an anti-reflective coating (ARC) layer is formed on between the photoresist pattern 17 and the inter-layer insulation layer 16. However, this step of forming the ARC layer is omitted for a convenience.

Referring to FIG. 1C, the inter-layer insulation layer 16 and the etch stop layer 15 are etched by using the photoresist pattern 17 as an etch mask to thereby form a contact hole 18 exposing the impurity diffusion region 14 disposed between the gate electrodes G1 and G2.

Herein, the contact hole 18 is formed through three procedural steps: with consideration that the inter-layer insulation layer 16 and the gate hard mask 13 have different etch selectivity values, a SAC etching process is first performed to etch the inter-layer insulation layer 16 with use of the photoresist pattern as an etch mask and is stopped at the etch stop layer 15; second, the etch stop layer 15 is removed to expose a predetermined portion of the substrate 10, i.e., the impurity diffusion region 14; and third, a cleaning process is performed to extend an opening of the contact hole 18 and remove etch remnants. In such SAC etching process, a mixed gas of $C_xF_y$, where subscripts x and y each representing an atomic ratio range from about 1 to about 10, and $C_aH_bF_c$, where subscripts a, b and c each representing an atomic ratio range from about 1 to about 10, is mainly used as an etch gas. Herein, carbon tetrafluoride ($CF_4$) and difluoromethane ($CH_2F_2$) are examples of the aforementioned etch gases, i.e., $C_xF_y$ and $C_aH_bF_c$.

Meanwhile, the height of each gate electrode pattern G1 and G2 is increased because of large scale of integration. Thus, the SAC etching process applied to the increased height of the etch target inevitably accompanies an elongated etch time and over-use of an etch gas. These facts eventually result in damages of the gate hard mask 13 of each gate electrode G1 and G2, and the reference number 19 denotes the damaged gate hard mask 13.

The photoresist pattern 17 is then removed by an ashing process. If the ARC layer is made of an organic-based material, the ARC layer is also removed along with the photoresist pattern 17.

Referring to FIG. 1D, a conductive material for forming a plug is deposited on an entire surface of the above structure including the contact hole 18 so to sufficiently fill the contact hole 18. Then, a planarization process exposing the gate hard mask 13 is performed to form a plug 20 electrically connected to the impurity diffusion region 14 through the contact hole 18 and having a planarized upper surface. The plug 20 is typically made of polysilicon. In addition to the use of polysilicon, it is still possible to stack the polysilicon with a barrier metal layer of titanium (Ti) and titanium nitride (TiN) or to use tungsten instead.

Since the gate hard mask 13 is damaged during the SAC etching process, insulation between the plug 20 and the gate conductive layer 12 is deteriorated. Also, if the gate conductive layer 12 is exposed by the severe damages of the gate hard mask 13, an electric short circuit may occur between the plug 20 and the gate conductive layer 12. This electric short circuit is denoted as the reference number 21 in FIG. 1D.

Because of the large scale of integration, the gate hard mask 13 is inevitably damaged during the process for forming the landing plug contact. Also, the thickness of the photoresist pattern is needed to be decreased to obtain high resolution, and thus, the function of the photoresist pattern as a mask is weakened during the SAC etching process. Accordingly, to solve this problem, a hard mask is formed between an etch target layer and the photoresist or between the etch target layer and the ARC layer if formed. Typically, tungsten and polysilicon are materials used in the hard mask. This new adaptation of the hard mask formation is widely used in photolithography using a light source of KrF or ArF.

A photoresist for use in the ArF photolithography (herein after referred to as the ArF photoresist) have been commonly used. The ArF photoresist is made of a polymer-based material such as cyclic-olefin-maleic anhydride (COMA) and acrylate and an admixture of these two materials. Although the ArF photolithography has an advantage of micronization, it still has disadvantages compared to the KrF photolithography.

FIG. 2 is a micrograph of scanning electron microscopy (SEM) showing the deformed ArF photoresist patterns during a landing plug contact formation process. FIG. 3 is a micrograph of SEM showing the damaged gate hard mask during the landing plug contact formation process using the ArF photolithography. FIG. 4 is a micrograph of SEM showing the collapsed ArF photoresist patterns during the landing plug formation process using the ArF photolithography.

Referring to FIG. 2, a striation phenomenon occurs during the SAC etching process for forming photoresist patterns in the course of performing the landing plug contact process using the ArF photolithography. This striation phenomenon is denoted as the reference symbol A. This striation phenomenon A is caused by a specific characteristic of the ArF photoresist; that is, the ArF photoresist has a weak etch tolerance to a fluorine-based gas generally used in the SAC etching process for forming the landing plug contact.

Referring to FIG. 3, after the SAC etching process, the thickness of the damaged gate hard mask is greater than about 800 Å.

Referring to FIG. 4A, the ArF photoresist pattern formed in a bar type is collapsed, and this pattern collapse denoted as the reference symbol C in FIG. 4A. The collapsed pattern further results in a defective semiconductor device. Referring to FIG. 4B, defective patterns denoted as the reference symbol D are observed at weak points of the ArF photoresist.

The landing plug contact process and the ArF photolithography process have a trade-off relationship with respect to their objects: the landing plug contact process is intended to minimize damages of the gate hard mask and secure the contact area; and the ArF photolithography is intended to prevent the pattern deformation. Thus, changes in parameters affecting the above processes such as an electrode temperature and a power trade-off the targeted object of one process in exchange of targeted object of the other process. This fact further results in a decrease in process margins. Therefore, it is difficult to set up process conditions.

For instance, in case of employing the KrF photolithography process, it is preferable to maintain the electrode temperature at about 60° C. during the SAC etching process for forming the landing plug contact. However, in case of employing the ArF photolithography process, the electrode temperature should be maintained at about 0° C. because of the pattern deformation occurring when if the electrode temperature is maintained at about 60° C. during the SAC etching process. The lower temperature of the electrode provides an effect of preventing the pattern deformation. However, this lowered temperature of the electrode conversely causes a decrease in etch selectivity ratios between an oxide layer and a nitride layer, both being essential for the SAC etching process.

Under the same conditions for the SAC etching process, the use of ArF photolithography results in the loss of the gate hard mask with more than about 200 Å compared to the KrF photolithography. If the thickness of the gate hard mask is increased to compensate the loss of the gate hard mask, the height of the gate electrode pattern is also increased. This increased height of the gate electrode pattern further increases an aspect ratio between the height of the gate electrode pattern and a spacing distance of the gate electrode pattern. Eventually, it is difficult to secure an intended contact area, and a gap-fill property of the inter-layer insulation layer is deteriorated.

For another method for compensating the loss of the gate hard mask, an upper part of the gate hard mask is capped in an over-hang structure by using an undoped silicate glass (USG) layer having a poor step coverage property. However, the capped gate hard mask is a main cause of an incidence of contact-not-open phenomenon even in the KrF photolithography due to a difficulty in controlling the thickness of the inter-layer insulation layer, which is an oxide-based layer. Thus, it is necessary to omit the above capping method in order to form a realizable and competitive landing plug contact.

There are problems of the landing plug contact formation process with the application of the ArF photolithography; they are, generations of weak points in the photoresist pattern because of the thin thickness of the photoresist and a poor etch tolerance and a pattern collapsing phenomenon caused by an increase in the aspect ratio.

To solve the above mentioned problems, a hard mask made of tungsten or polysilicon is formed on between the photoresist pattern and the etch target layer. With use of the tungsten or polysilicon for forming the hard mask, it is possible to decrease the thickness of the photoresist, thereby improving photosensitivity during the photo-exposure process and to solve the problems such as the pattern deformation arose in the ArF photolithography process, the loss of the gate hard mask and the decrease in the contact area both observed in the landing plug contact formation process.

Since tungsten and polysilicon is conductive materials, a process for removing this conductive material is essentially required. Also, the SAC etching process for etching such conductive material and that for etching the inter-layer insulation layer should be proceed at different chambers, and thereby elongating an etching period. Also, there is an additional problem in contamination caused by particles generated when the SAC etching processes are performed in an ex-situ condition. These problems arose in the SAC etching process for forming an intaglio pattern are also shown in a process for forming an emboss pattern such as a gate electrode pattern, a bit line and a metal wire.

Furthermore, for the landing plug contact formation process, since the tungsten and polysilicon doe not have selectivity with respect to the substrate, it is difficult to grow a plug material by applying a selective epitaxial growth (SEG) with use of difference in selectivity between the exposed substrate and the inter-layer insulation layer.

SUMMARY OF THE INVENTION

It is, therefore, an object of the present invention to provide a method for fabricating a semiconductor device with a fine pattern by performing an ArF photolithography without employing a capping process.

It is another object of the present invention to provide a method for fabricating a semiconductor device capable of preventing pattern deformation created by the use of ArF photolithography.

It is further another object of the present invention to provide a method for fabricating a semiconductor device capable of applying the ArF photolithography along with a selective epitaxial growth (SEG) technique.

In accordance with an aspect of the present invention, there is provided a method for fabricating a semiconductor device, including the steps of: (a) forming a semiconductor substrate structure including a substrate, a nitride layer for forming a hard mask, a plurality of conductive patterns, an etch stop layer, an inter-layer insulation layer, an anti-reflective coating (ARC) layer and a photoresist pattern; (b) selectively etching the ARC layer and the nitride layer with use of the photoresist pattern as an etch mask to form a hard mask; (c) removing the photoresist pattern and the ARC layer; (d) etching the inter-layer insulation layer disposed between the conductive patterns by using the hard mask as an etch mask to form a contact hole exposing the etch stop layer; (e) removing the etch stop layer formed at a bottom area of the contact hole to expose the substrate; and (f) forming a plug electrically contacted to the exposed substrate, wherein the steps (b) and (d) to (e) proceeds in an in situ condition.

In accordance with another aspect of the present invention, there is also provided a method for fabricating a semiconductor device, including the steps of: (a) forming a semiconductor substrate structure including a substrate, a nitride layer for forming a hard mask, a plurality of conductive patterns, an etch stop layer, an inter-layer insulation layer, an anti-reflective coating (ARC) layer and a photoresist pattern; (b) loading the resulting semiconductor substrate structure into an etching equipment having at least two chambers; (c) selectively etching the ARC layer and the nitride layer with use of the photoresist pattern as an etch mask to form a hard mask; (d) removing the photoresist pattern and the ARC layer; (e) etching the inter-layer insulation layer disposed between the conductive patterns by using the hard mask as an etch mask to form a contact hole exposing the etch stop layer; (f) removing the etch stop layer formed at a bottom area of the contact hole to expose the substrate; and (g) forming a plug electrically contacted to the exposed substrate, wherein the steps (c) and (e) to (f) proceeds in an in situ condition.

BRIEF DESCRIPTION OF THE DRAWINGS(S)

The above and other objects and features of the present invention will become apparent from the following description of the preferred embodiments given in conjunction with the accompanying drawings, in which.

DETAILED DESCRIPTION OF THE INVENTION

According to a preferred embodiment of the present invention, a hard mask made of nitride is formed on between a photoresist pattern and an etch target layer or between the etch target layer and an anti-reflective coating layer if formed during a contact hole formation process. The use of such hard mask makes it possible to prevent pattern deformation occurring during an ArF photolithography in the course of forming an ultra fine pattern.

Hereinafter, detailed descriptions on the above preferred embodiment will be provided.

FIGS. 5A to 5F are cross-sectional views illustrating a process for fabricating a semiconductor device with a fine pattern in accordance with the preferred embodiment of the present invention.

Figure 1A:
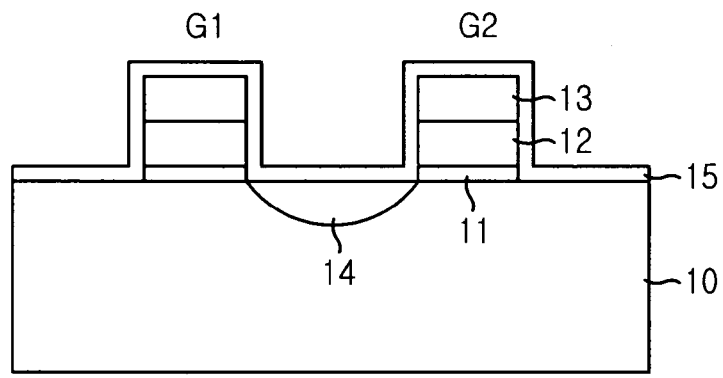
FIGS. 1A to 1D are cross-sectional views illustrating a conventional method for forming a landing plug contact.
Figure 1B:
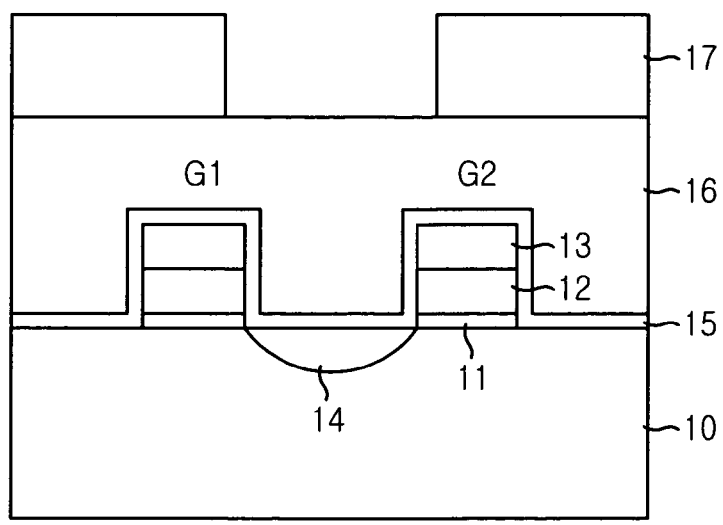
Figure 1C:
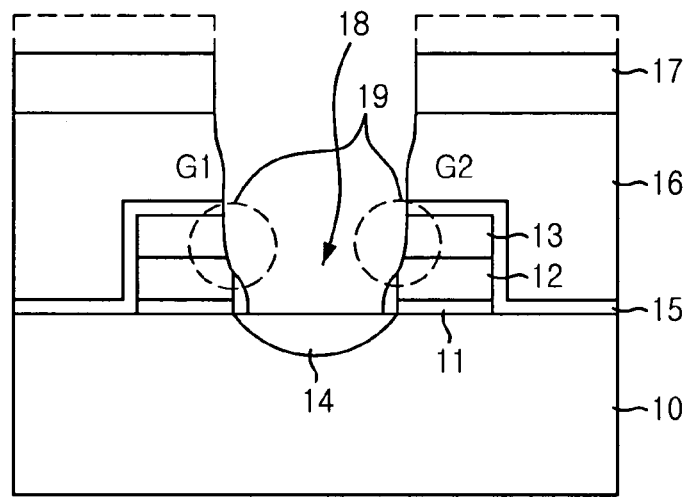
Figure 1D:
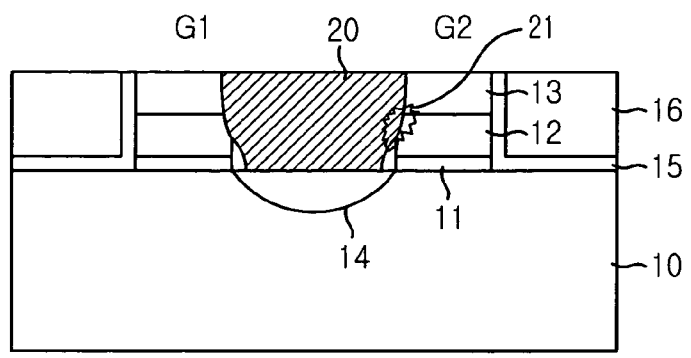
Figure 2:
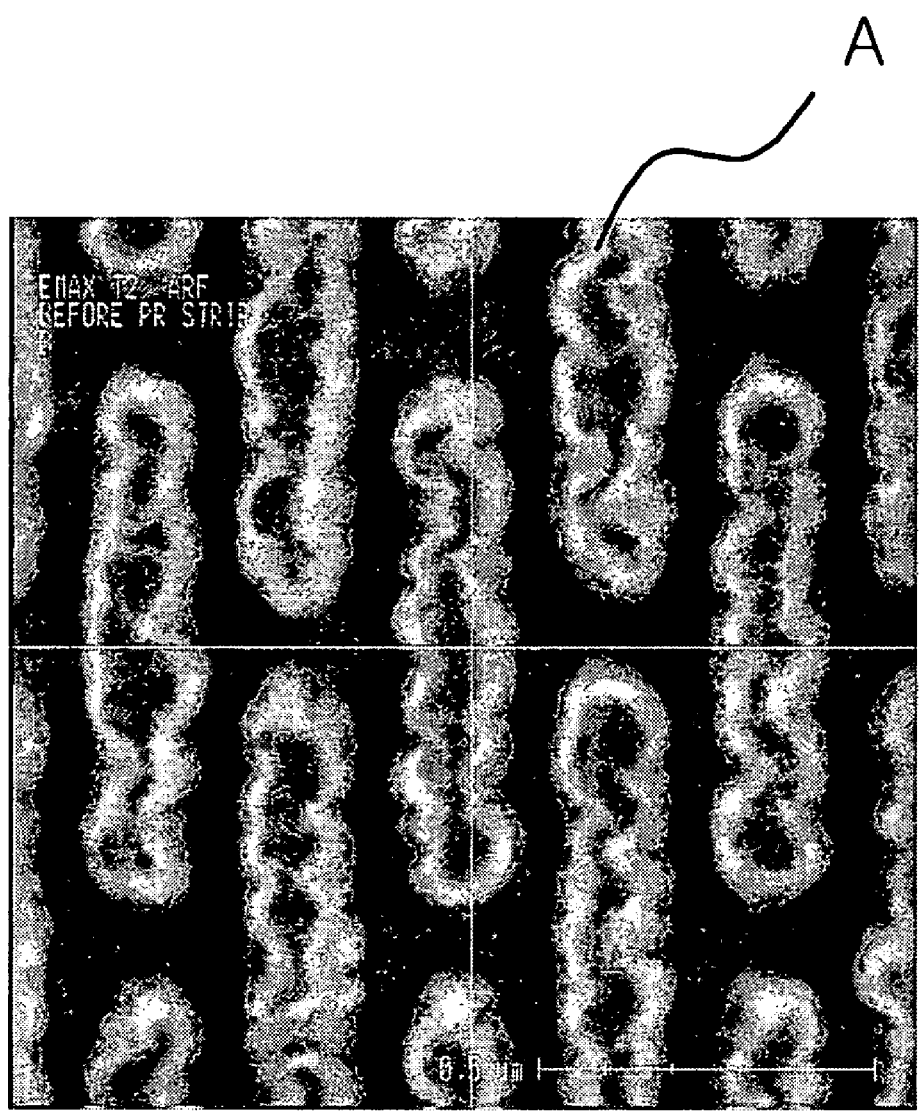
FIG. 2 is a micrograph of scanning electron microscopy (SEM) showing ArF photoresist patterns deformed during a landing plug contact formation process.
Figure 3:
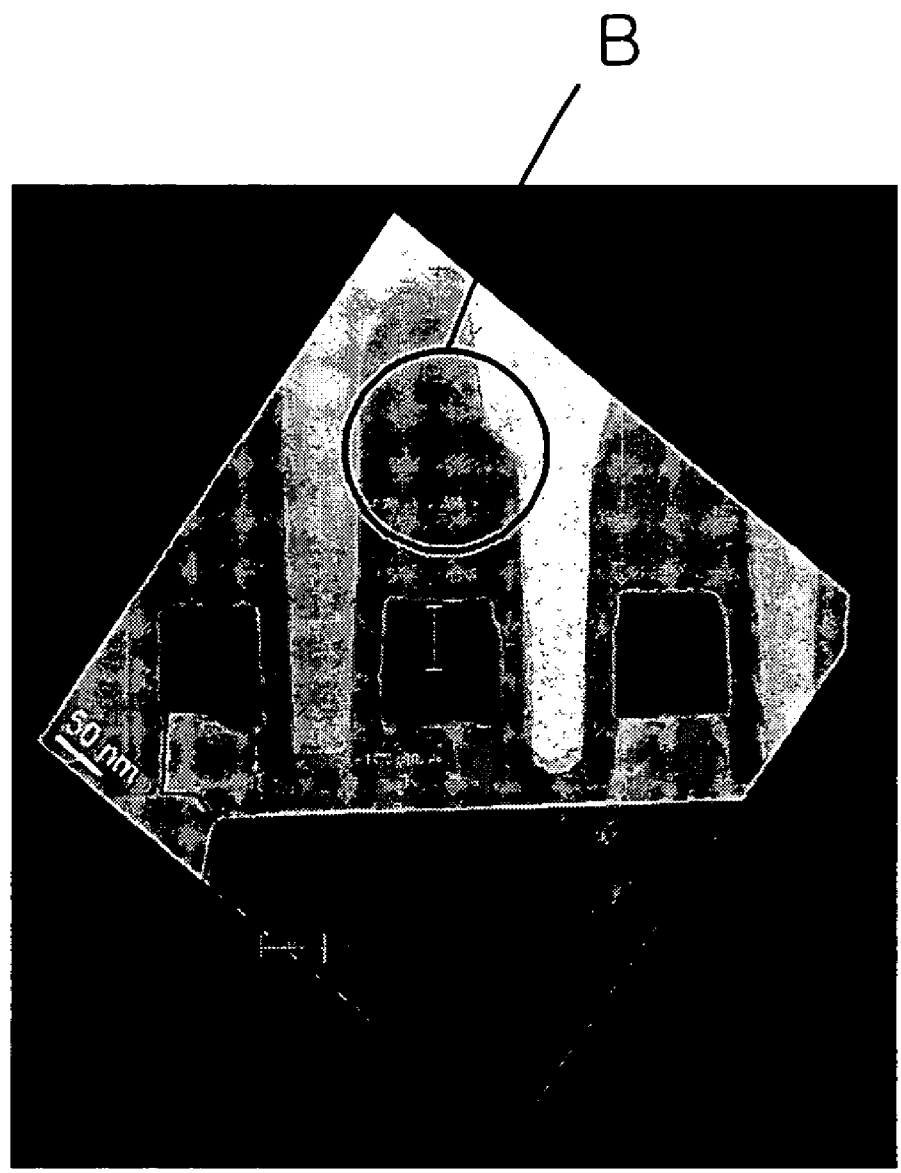
FIG. 3 is a micrograph of SEM showing a damaged gate hard mask during a landing plug contact process to which an ArF photolithography process is applied.
Figure 4A:
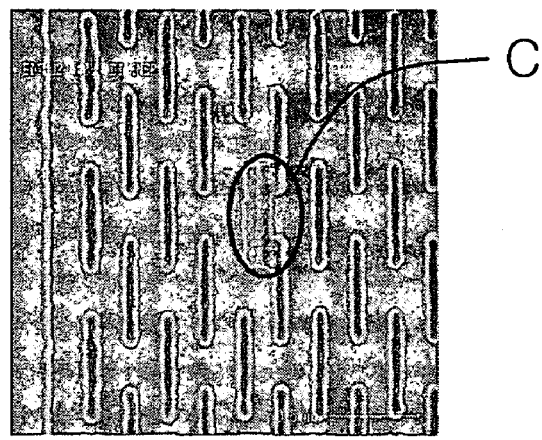
FIG. 4A is a micrograph of SEM showing a pattern collapsing phenomenon occurring during the landing plug contact formation process to with the ArF photolithography is applied.
Figure 4B:
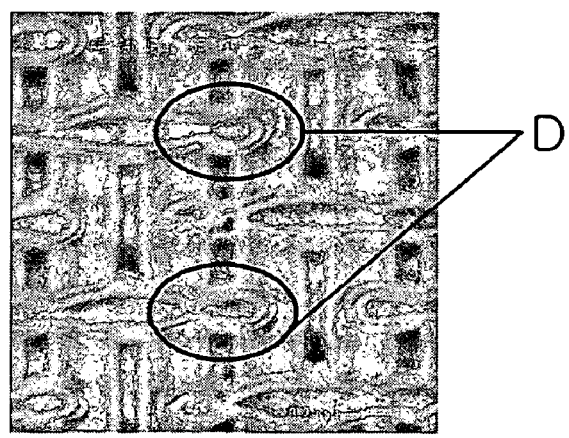
FIG. 4B is a micrograph of SEM showing defective patterns caused by the pattern collapsing phenomenon shown in FIG. 4A.
Figure 5A:
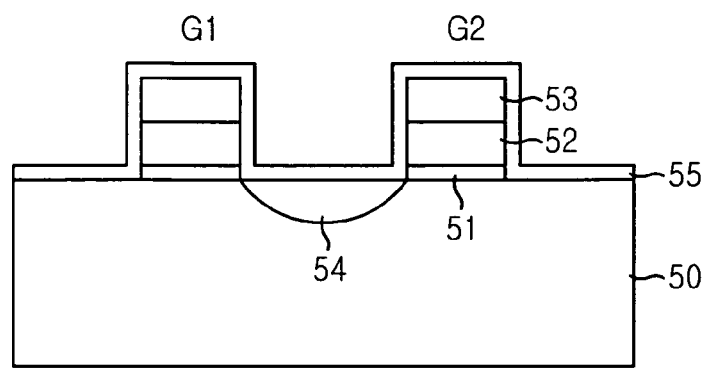
FIGS. 5A to 5F are cross-sectional views illustrating a process for fabricating a semiconductor device with a fine pattern in accordance with a preferred embodiment of the present invention.

Referring to FIG. 5A, a plurality of gate electrode patterns G1 and G2, each having a stack structure of a gate hard mask 53, a gate conductive layer 52 and a gate insulation layer 51, are formed on a substrate 50 in which various elements such as a filed insulation layer and a well are formed.

The gate insulation layer 51 is typically an oxide-based layer. The gate conductive layer 52 is a single layer made of a material selected from a group consisting of polysilicon, tungsten (W), tungsten nitride ($WN_x$) and tungsten silicide ($WSi_x$) or stacked layers of the above materials in any combination.

Particularly, the gate hard mask 53 serves to prevent the gate conductive layer 52 from being attacked in the course of forming a contact hole by etching a subsequently formed inter-layer insulation layer. Thus, the gate hard mask 53 is made of a material giving a different etch rate from that of the inter-layer insulation layer. For instance, if the inter-layer insulation layer is made of an oxide-based material, the gate hard mask 53 is made of a nitride-based material such as silicon nitride (SiN) and silicon oxynitride (SiON). If the inter-layer insulation layer is made of a polymer-based material with a low dielectric coefficient, the gate hard mask 53 is made of an oxide-based material.

Next, an impurity diffusion region 54 such as a source/drain junction region is formed in a predetermined portion of the substrate 50 disposed between the gate electrode patterns G1 and G2.

In case that the impurity diffusion region 54 is formed in between the gate electrode patterns G1 and G2 through the use of an ion-implantation, the impurity diffusion region 54 is self-aligned to the gate electrodes G1 and G2, and then, an impurity is ion-implanted onto the substrate 50. Thereafter, a spacer is formed on sidewalls of each gate electrode pattern G1 and G2. Then, another ion-implantation is performed to form a lightly doped drain (LDD) structure. Herein, detailed descriptions on processes for forming the LDD structure and the spacer are omitted.

An etch stop layer 55 is formed along a profile containing the gate electrode patterns G1 and G2. Herein, the etch stop layer 55 serves to stop a self-aligned contact (SAC) etching at a certain point so as to prevent the substrate 50 from being attacked during the SAC etching process. Also, the etch stop layer 55 is made of a nitride-based material such as silicon nitride and silicon oxynitride.

Figure 5B:
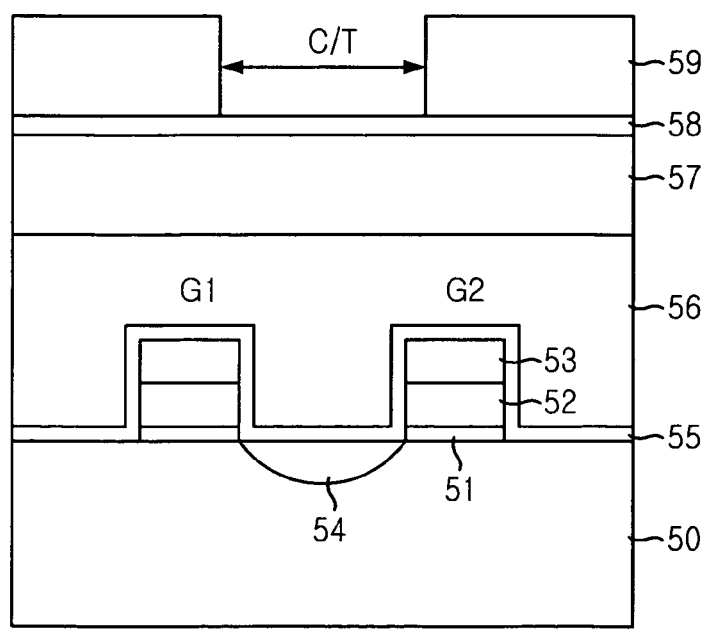

Referring to FIG. 5B, an inter-layer insulation layer 56 made of an oxide-based material is formed on an entire surface of the above resulting structure. Examples of the oxide-based material for forming the inter-layer insulation layer 56 are borosilicate glass (BSG), borophosphosilicate glass (BPSG), phosphosilicate glass (PSG), tetraethylorthosilicate (TEOS), high density plasma (HDP) oxide and spin-on-glass (SOG). In addition to the use of the oxide-based material, the inter-layer insulation layer 56 can be made of an organic or inorganic material with a low dielectric coefficient.

After the formation of the inter-layer insulation layer 56, a nitride layer 57 for use in a hard mask (hereinafter referred to as the hard mask nitride layer) is formed on the inter-layer insulation layer 56. Herein, the hard mask nitride layer 57 has a different etch selectivity value from that of the inter-layer insulation layer 56. Preferably, the hard mask nitride layer 57 is formed by performing a plasma enhanced chemical vapor deposition (PECVD) technique or a low pressure chemical vapor deposition (LPCVD) technique. Also, a preferable deposition thickness of the hard mask nitride layer 57 is determined by considering a thickness of a lost portion of the hard mask nitride layer 57 during the SAC etching process for etching the inter-layer insulation layer 56 and a thickness of another lost portion of the hard mask nitride layer 57 when the etch stop layer 55 is etched to expose the impurity diffusion layer 54. In other words, the deposition thickness of the hard mask nitride layer 57 is preferably the total thickness of the lost portions so that the hard mask nitride layer 57 can be naturally removed during the etching of the etch stop layer 55 in an in situ condition or is greater than the total thickness.

For instance, in the preferred embodiment of the present invention, with consideration of the thickness of the lost portion of the hard mask nitride layer 57 during the SAC etching process, i.e., about 300 Å, and the thickness of the lost portion of the hard mask nitride layer 57 during the etching of the etch stop layer 55, i.e., about 300 Å, the total deposition thickness of the hard mask nitride layer 57 ranges from about 500 Å to about 800 Å in case of a sub 100 nm device. However, the deposition thickness can be variable depending on a reticle or device type.

Subsequent to the formation of the hard mask nitride layer 57, an anti-reflective coating (ARC) layer 58 is formed on the hard mask nitride layer 57. Herein, the ARC layer 58 serves to prevent formation of undesired patterns resulting from scattered reflection caused by an increased index of reflectance of the hard mask nitride layer 57 and to improve adherence of the hard mask nitride layer 57 with a photoresist which will be subsequently formed. Preferably, the ARC layer 58 is made of an organic material having a similar etch characteristic with the photoresist. Although the preferred embodiment of the present invention exemplifies the use of the ARC layer 58, the step of forming the ARC layer 58 can be omitted depending on a fabrication process.

Next, an ArF photoresist is coated on the ARC layer 58 with a predetermined thickness by employing a spin coating method. A predetermined portion of the ArF photoresist is selectively photo-exposed by using a light source of ArF and a reticle (not shown) for defining a width of a contact hole, and a developing process makes the photo-exposed portion and a non-photo-exposed portion remain. Thereafter, a cleaning process is performed to remove etch remnants to thereby form a photoresist pattern 59 for forming a landing plug contact. Herein, a contact hole region for forming the landing plug contact is denoted as the reference symbol C/T in FIG. 5B.

The conventional use of tungsten and polysilicon as the hard mask makes it difficult to detect an over-lay because these materials have high indices of reflectance, and thereby necessitating an additional alignment key opening process when a mask is aligned. Contrary to the use of the tungsten and polysilicon, nitride used for the hard mask has a low index of reflectance and thus, the mask alignment can proceed without difficulty.

The photoresist is formed with the thickness needed for etching the hard mask nitride layer 57. Therefore, the thickness of the photoresist is thinner than the photoresist used for a case that the hard mask is not formed or that the hard mask is formed by using tungsten and polysilicon. This thin thickness also improves ability in defining the pattern more precisely to thereby form a fine pattern without an incidence of pattern collapsing.

As a result, this thin photoresist can be also used in a technology providing a device with a minimum linewidth less than about 80 nm. For example, since the expected thickness of the photoresist is about 1500 Å in such technology, the minimum thickness of the photoresist required for etching the hard mask nitride layer 57 having a thickness of about 700 Å is about 1000 Å.

Figure 5C:
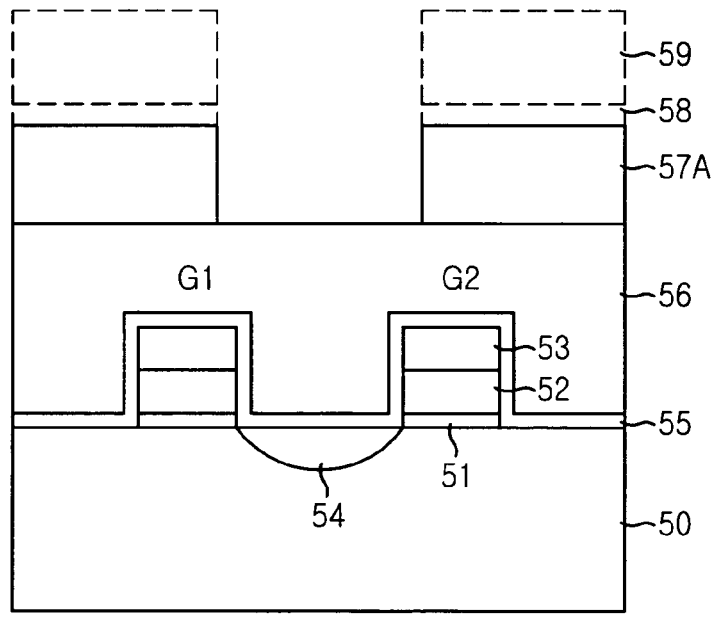

Referring to FIG. 5C, the substrate 50 on which the photoresist pattern 59 is formed is loaded into an etching equipment having at least two chambers. The ARC layer 58 and the hard mask nitride layer 57 are etched by using the photoresist pattern 59 as an etch mask, so that a hard mask 57A is formed.

In case of performing the ArF photolithography, it is difficult to set up process conditions for forming the hard mask 57A pattern by etching a line type nitride layer. Thus, it is very important to secure process conditions with respect to the nitride layer having a thickness less than about 1000 Å.

In more detail, when the hard mask nitride layer 57 is etched, it is required to perform the etching with specific conditions that suppress striation and deformation of the photoresist patterns. That is, an electrode temperature needs to be low, and a plasma source and a bias are independently controlled within the etching equipment. Also, it is advantageous when the bias power is extremely low. For instance, it is experimentally verified that preferable conditions for obtaining the above effects are about 50 mTorr of a chamber pressure, about 1000 W of a source power, about 200 W of a bias temperature, about 0° C. of an electrode temperature along with about 20 sccm of oxygen ($O_2$) and about 100 sccm of carbon tetrafluoride ($CF_4$) in case that a super captive coupled module (SCCM) etching equipment developed by the TEL company in Japan is used.

The above mentioned etching conditions make it possible to simultaneously etch the ARC layer 58 made of the organic material and the hard mask nitride layer 57 and are important to realize a structure of the hard mask 57A as shown in FIG. 5C. At this time, a critical dimension (CD) of the hard mask 57A formed in a bar type can be also controlled by controlling an etch gas and an etching period. As a result, it is possible to increase a margin for securing a CD of a bottom part of the contact hole formed by the subsequent SAC etching process.

Next, the photoresist pattern 59 is removed by an ashing process. If the ARC layer 58 is made of an organic-based material, the ARC layer 58 is removed simultaneous to the removal of the photoresist pattern 59. A photoresist stripping process and an oxygen ($O_2$) plasma treatment are examples of the ashing process. Herein, the photoresist pattern 59 should be removed since the remaining photoresist pattern 59 can result in defects in the pattern during the subsequent SAC etching process.

Figure 5D:
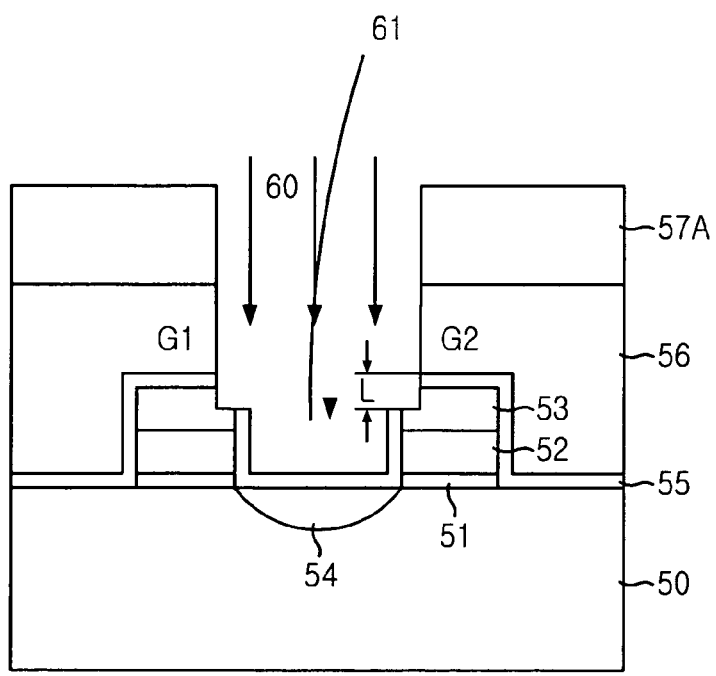

Referring to FIG. 5D, the above mentioned SAC etching process denoted as the reference number 60 is performed. That is, the inter-layer insulation layer 56 is etched by using the hard mask 57A as an etch mask until the etch stop layer 55 disposed between the gate electrode pattern G1 and G2 is exposed. From this SAC etching process, a contact hole 61 is formed.

At this time, the etching of the inter-layer insulation layer 56 proceeds without any concern on the photoresist pattern 59 deformation. Thus, such conditions providing specific SAC etching characteristics are applied to maximize the etch selectivity of the inter-layer insulation layer 56 with respect to the hard mask 57A and to sufficiently secure the CD of the bottom part of the contact hole 61.

For such conditions for the SAC etching process, it is essential to use an etch gas providing high etch selectivity since the photoresist limits supply of carbon source. Thus, it is preferable to use such a gas producing lots of $CF_2$ radicals, e.g., $C_4F_6$ and $C_5F_8$, instead of using the conventionally used $C_4F_8$.

However, since the use of etch gas providing high selectivity conversely makes it difficult to secure the CD of the bottom part of the contact hole 61 sufficiently, the electrode temperature is maintained at about 40° C. to improve the etch selectivity and oxygen ($O_2$) is added to secure the intended CD of the bottom part of the contact hole 61.

It is experimentally verified that preferable SAC etching process conditions for obtaining such effects are about 40 mTorr of a chamber pressure, about 500 W of a source power, about 1200 W of a bias temperature, about 40° C. of an electrode temperature along with about 7 sccm of $C_5F_8$, about 800 sccm of Ar and about 5 sccm of $O_2$ in case that a SCCM etching equipment developed by the TEL company in Japan is used. Under these SAC etching process conditions, the thickness L of the damaged gate hard mask 53 is about 350 Å. This thickness L is less than the thickness of the damaged gate hard mask when the conventional SAC etching process is performed. Typically, the latter thickness ranges from about 800 Å to about 900 Å. Thus, even if the thickness of the additionally damaged gate hard mask 53 during an etching of the etch stop layer 55, i.e., about 300 Å, is added with the above thickness L of the gate hard mask 53, i.e., about 300 Å, the total loss of the gate hard mask 53 is decreased more than that of the gate hard mask subjected to the conventional SAC etching process.

As a result, it is not necessary to protect the gate hard mask 53 by forming a capping layer made of a material such as undoped silicate glass (USG) on an upper part of each gate electrode pattern G1 and G2. The omission of the capping process simplifies an overall process and prevents an incidence of contact-not-open phenomenon generally occurring during the etching of the etch stop layer 55 for opening the contact because of the capping layer formed with inconsistent thickness inside of the contact hole.

Figure 5E:
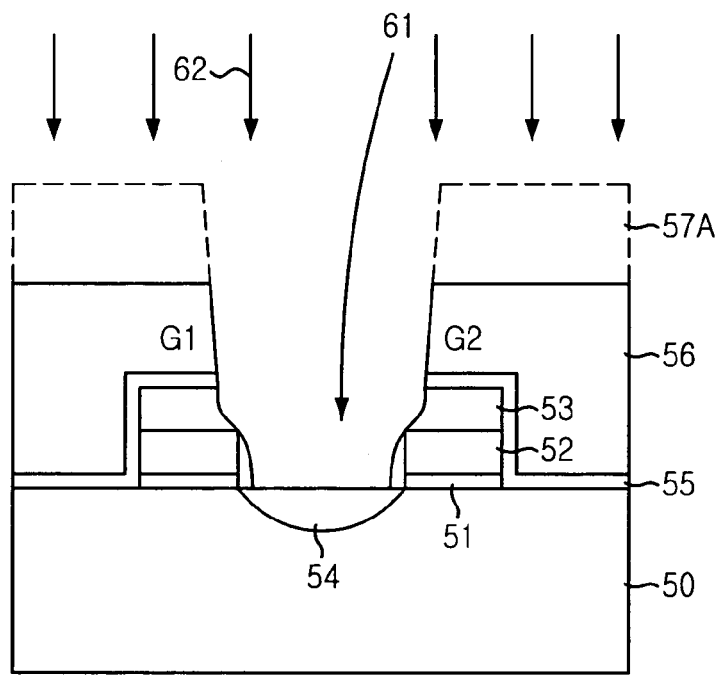

Referring to FIG. 5E, a blanket etch process denoted as the reference number 62 is performed to expose a predetermined portion of the substrate 50, particularly, the impurity diffusion region 54. At this time, the thickness of the additionally damaged gate hard mask 53 is nearly the same as the thickness of the etched portion of the etch stop layer 55, i.e., about 300 Å. Thus, the total thickness of the damaged gate hard mask 53 ranges from about 600 Å to about 700 Å.

Also, it is preferred that the hard mask 57A remaining on the inter-layer insulation layer 56 is removed in an in situ condition during the etching of the etch stop layer 55. The reason for this in situ removal is because the hard mask 57A may be lifted during a subsequent cleaning process and the remaining hard mask 57A may become a burden during a planarization process performed for isolating plugs.

Therefore, the thickness of the hard mask 57A, determined by considering the damaged portion of the hard mask 57A during the etching of the inter-layer insulation layer 56 and that of the hard mask 57A during the etching of the etch stop layer 55, ranges from about 600 Å to about 700 Å.

Since the hard mask 57A is made of the insulating nitride, which is a dielectric material, a series of processes for forming the landing plug contact can be performed in an in situ condition at the same equipment. For instance, in case of using a two chamber body equipment with a built-in photoresist stripper, the photoresist stripping process is performed at a different chamber from the chamber at which the ArF photolithography for forming the hard mask 57A and the SAC etching process for etching the inter-layer insulation layer 56 and the etching process for etching the etch stop layer 55 are performed. Thus, the use of this two chamber body equipment can solve the problem of contamination arose by proceeding the hard mask formation, wherein the hard mask is made of a conductive material such as polysilicon or tungsten, and the SAC etching process to the etching and removal of the etch stop layer respectively at different chambers. Also, the use of the two chamber body equipment can be an aid for shortening a turn around time when applied for mass production.

Figure 5F:
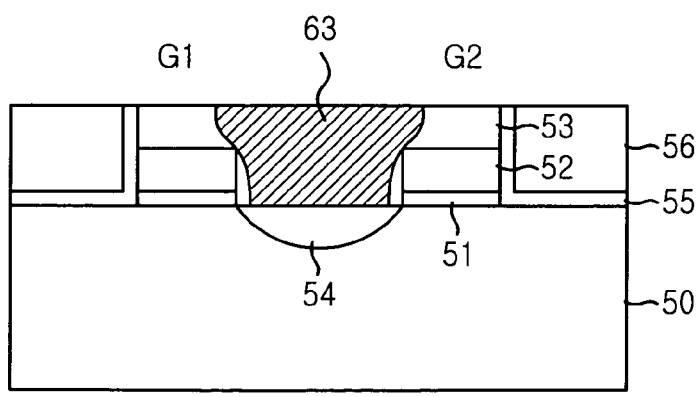

Referring to FIG. 5F, a conductive material for forming a plug is deposited along a profile containing the contact hole 61 to sufficiently fill the contact hole 61. Then, a planarization process is performed until the gate hard mask 53 is exposed, so that a plug 63 is formed thereafter. At this time, the plug 63 is electrically connected to the impurity diffusion region 54 through the contact hole 61 and has an upper surface planarized at the same plane level as an upper surface of the gate hard mask 53. Herein, polysilicon is the most generally used conductive material for forming the plug 63; however, tungsten can be also used as the conductive material for forming the plug 63. Also, the conductive material can be formed together with a barrier layer formed by stacking such materials as titanium (Ti) and titanium nitride (TiN).

For the planarization process, an etch-back process is first performed to the conductive material to reduce a height difference between a cell region and a peripheral circuit region. Meanwhile, it is possible to make the hard mask 57A remain in the peripheral circuit region by forming the hard mask nitride layer 57 thickly in the cell region than in the peripheral circuit region or by removing the etch stop layer 55 only in the cell region with use of a mask that opens only the cell region instead of employing the blanket etch process.

The reason for making the hard mask 57A remain in the peripheral circuit region is to prevent the isolated patterns, e.g., the gate electrode patterns G1 and G2, formed in the peripheral circuit region from being attacked. The isolated patterns are vulnerable to the etching process because of the difference in the pattern density between the cell region and the peripheral circuit region while a chemical mechanical polishing (CMP) process is performed for the planarization of the conductive material. As a result, it is further possible to improve margins for the CMP process.

Also, it is not necessary to perform the CMP process with a target to planarize the gate hard mask 53. Instead, the CMP process can be performed with a target that a partial portion of the inter-layer insulation layer 56 remains depending on types of the mask pattern used.

Recently, in addition to the above mentioned planarization process, a selective epitaxial growth (SEG) technique is frequently employed. For a case of applying the SEG technique to the conventional hard mask made of tungsten or polysilicon, silicon is grown even on the hard mask because the impurity diffusion region of the exposed substrate loses its specific selectivity with respect to the hard mask. Thus, it is required to remove the hard mask before performing the SEG technique.

However, in this preferred embodiment, since the hard mask 57A is made of nitride, it is not necessary to remove the hard mask 57A even if the SEG technique is performed. Thus, the SEG technique can be advantageously applied to such a process for fabricating 80 nm and below 80 nm devices with regardless of the plug formation process.

Also, it is possible to prevent seam generations by improving a profile of the inter-layer insulation layer 56 with use of the hard mask 57A. With use of the nitride-based hard mask 57A, the profile of the inter-layer insulation layer 56 has a slight positive slope, thereby preventing the seam generations.

Figure 6:
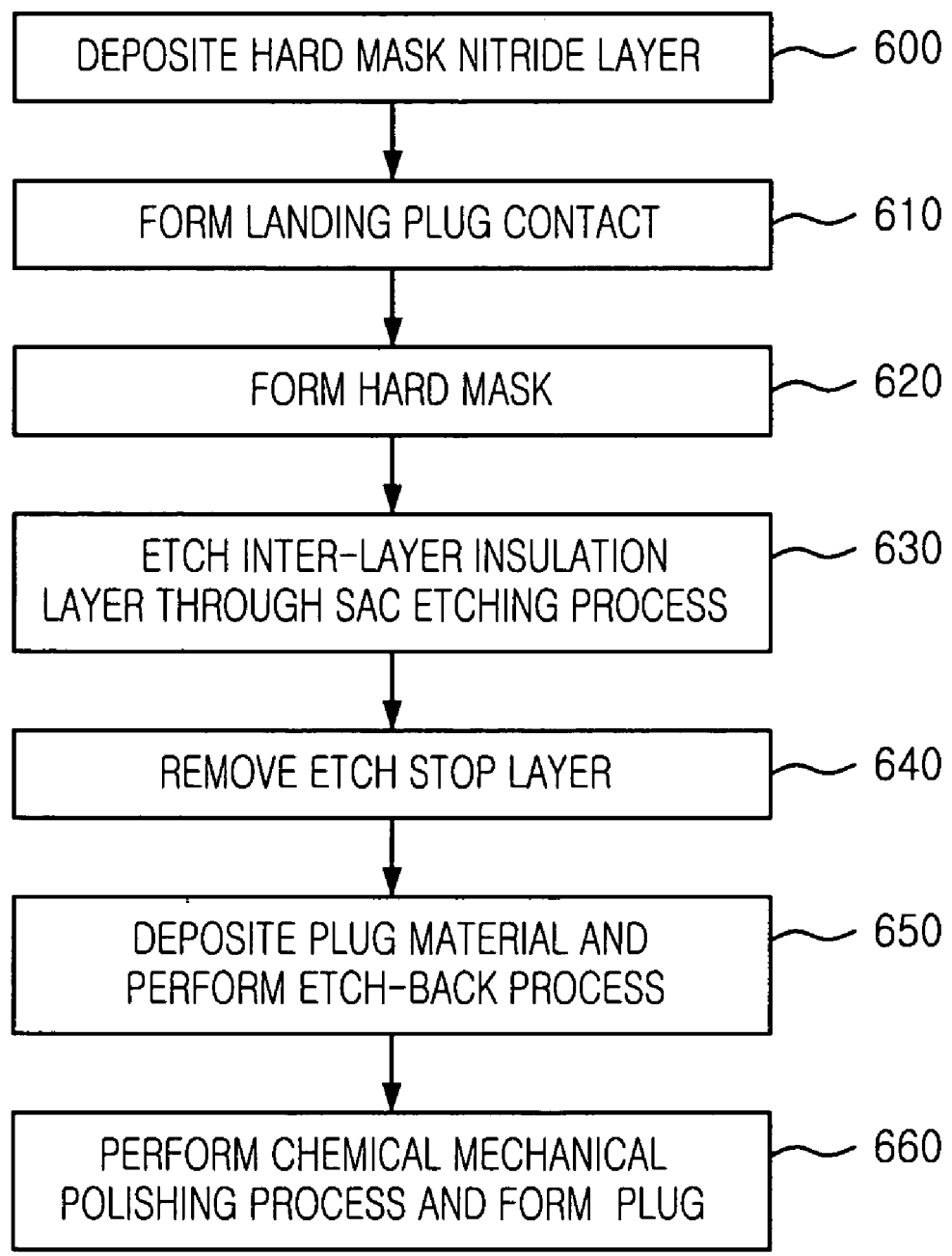
FIG. 6 is a flowchart showing sequential steps of forming a landing plug contact in accordance with the preferred embodiment of the present invention.

FIG. 6 is a flowchart showing sequential steps of forming the landing plug contact 63. With reference to this provided flowchart, advantages of using the nitride-based hard mask 57A will be explained in more detail.

At Step 600, the hard mask nitride layer 57 is first deposited on the substrate 50. Compared to the conventional hard mask made of a conductive material such as polysilicon, this use of nitride for forming the hard mask 57A decreases the turn around time. Also, the nitride-based hard mask 57A has an index of reflectance less than that of the conventional hard mask made of the conductive material. Thus, over-lay margins can be increased when the photoresist pattern 59 for forming the landing plug contact is formed at Step 610. Also, the thickness of the photoresist can be decreased, so that an intended CD of the contact can be secured and the photoresist patterns are suppressed from collapsing.

At Step 620, the hard mask nitride layer 57 is etched by using the photoresist pattern 59 as an etch mask to form the hard mask 57A. This etching process can be performed at the same equipment in which the subsequent SAC etching process for etching the inter-layer insulation layer 56 is performed at Step 630. That is, a chamber for use in etching an oxide layer can be used for forming the nitride-based hard mask.

Also, at Step 640, the etch stop layer 55 is removed to open the contact region, i.e., the impurity diffusion region 54. This removal of the etch stop layer 55 proceeds at the same equipment in which the SAC etching process is performed under the in situ condition.

At Step 650, the conductive material for forming the plug 63 is deposited into the contact hole 61 and is subjected to the etch-back process. As mentioned previously, the SEG technique can be alternatively employed, and the application of the SEG technique makes it possible to prevent the seam generations.

At Step 660, the planarization process, i.e., the CMP process, is performed to form a plurality of the plugs 63 isolated from each other. The hard mask formed in the peripheral circuit region prevents the patterns in the peripheral circuit region, e.g., the gate electrode patterns G1 and G2, from being attacked during the CMP process.

Figure 7A:
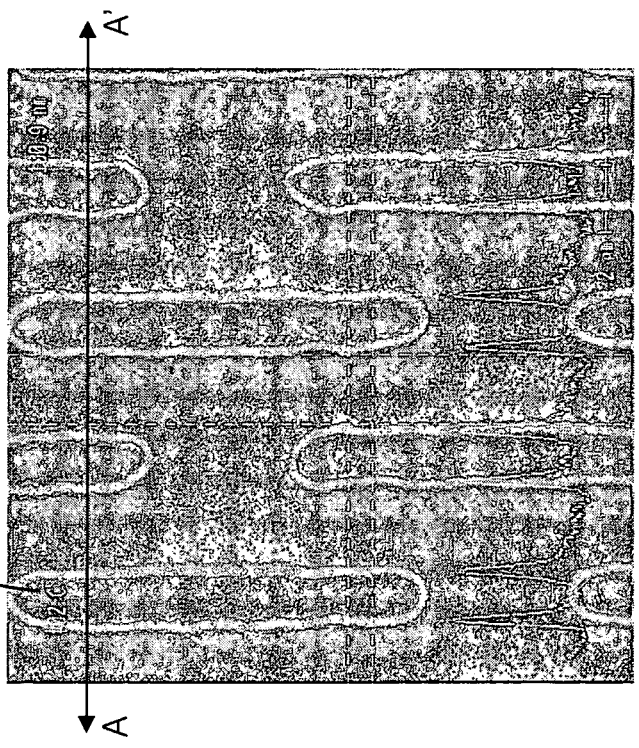
FIG. 7A is a micrograph of scanning electron microscopy (SEM) showing a top view of a hard mask 57A formed based on the preferred embodiment of the present invention.
Figure 7B:
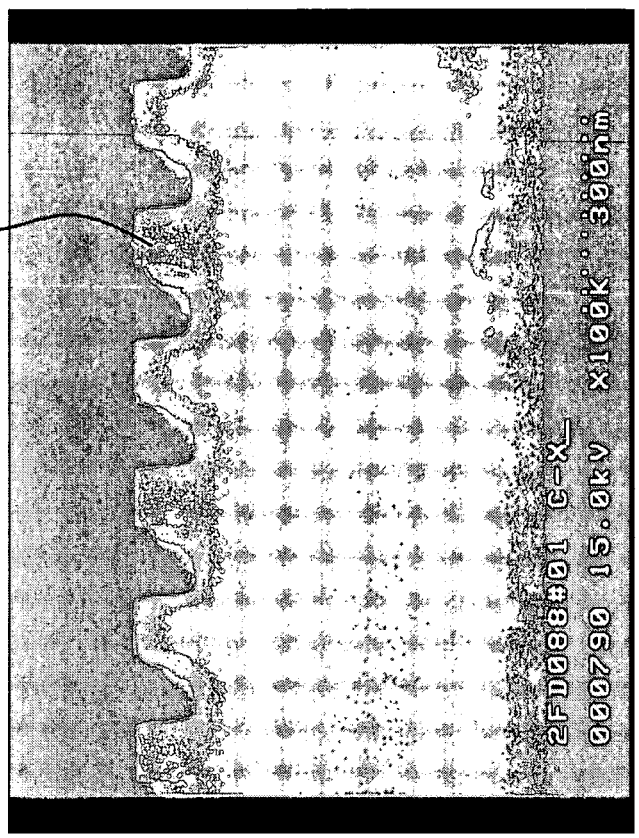
FIG. 7B is a micrograph of SEM showing a cross-sectional view of the hard mask in a direction of the line A–A' shown in FIG. 7A.

FIG. 7A is a micrograph of scanning electron microscopy (SEM) showing a top view of the hard mask 57A. FIG. 7B is a micrograph of SEM showing a cross-sectional view of the hard mask 57A in a direction of the line A–A' shown in FIG. 7A.

As shown, the pattern deformation and striation are hardly seen after the etching process for forming the hard mask 57A. As a result, it is possible to apply the above described SAC etching process conditions providing high etch selectivity when the inter-layer insulation layer 56 is etched to form the contact hole 61 by performing the SAC etching process at Step 630.

Figure 8B:
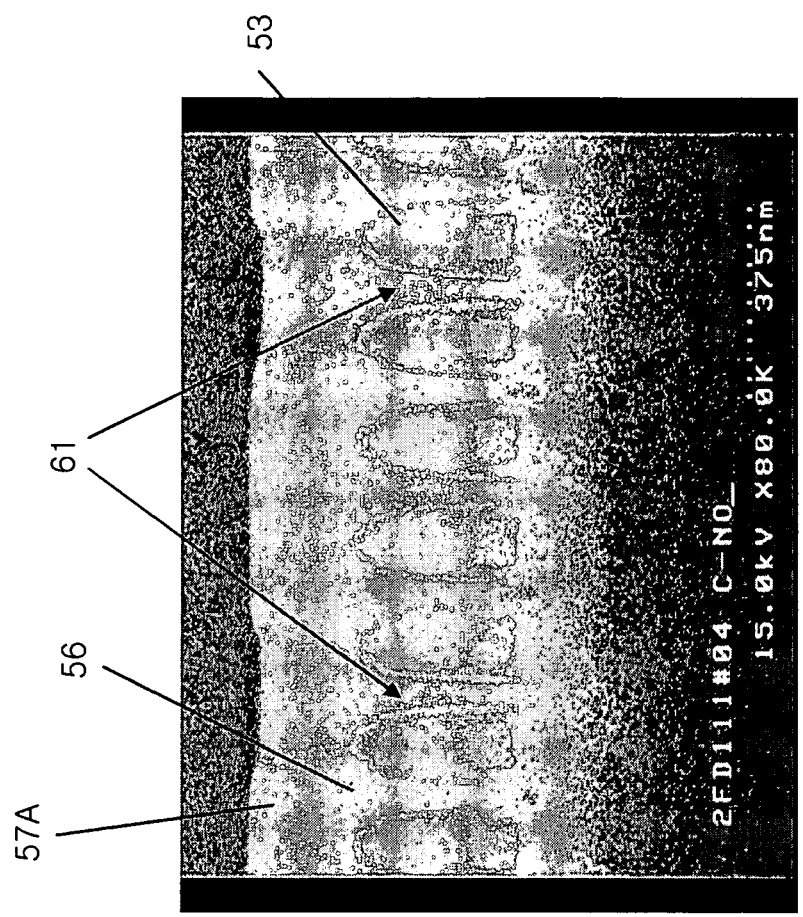
FIG. 8B is a micrograph of SEM showing a cross-sectional view of the hard mask structure in a direction of the line B–B' shown in FIG. 8A.
Figure 8A:
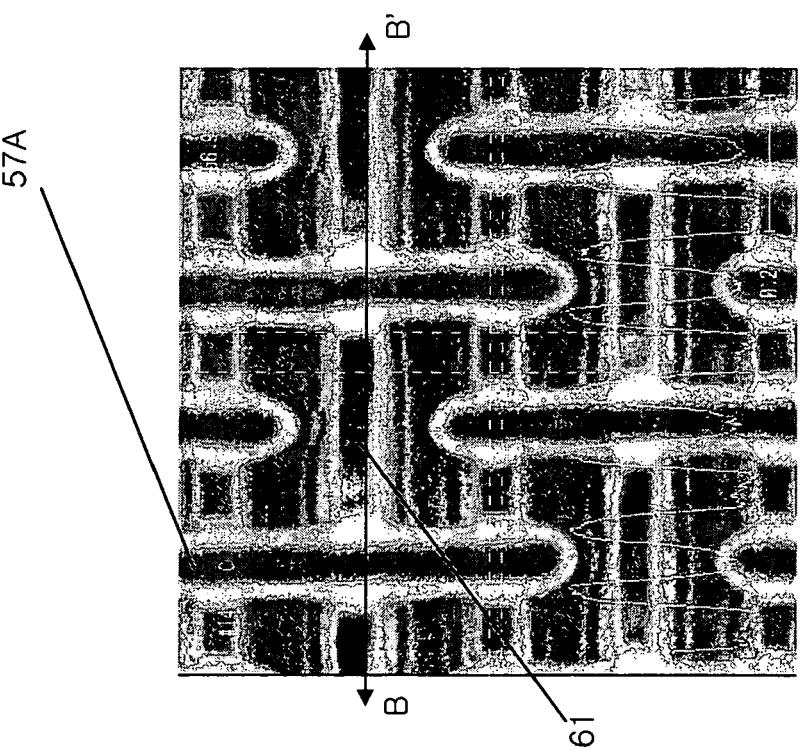
FIG. 8A is a micrograph of SEM showing a top view of a hard mask structure obtained after a SAC etching process.

FIG. 8A is a micrograph of SEM showing a top view of the hard mask 57A structure obtained after the SAC etching process. FIG. 8B is a micrograph of SEM showing a cross-sectional view of the hard mask 57A structure in a direction of the line B–B' shown in FIG. 8A.

Referring to FIGS. 8A and 8B, it is shown that the bottom area of the contact hole 61 can be secured with the CD greater than about 55 nm and the loss of the gate hard mask 53 can be decreased to less than about 350 Å. As described above, these effects are achieved by using nitride as the hard mask 57A to thereby increase an etch selectivity with respect to the inter-layer insulation layer 56 during the SAC etching process.

Figure 9B:
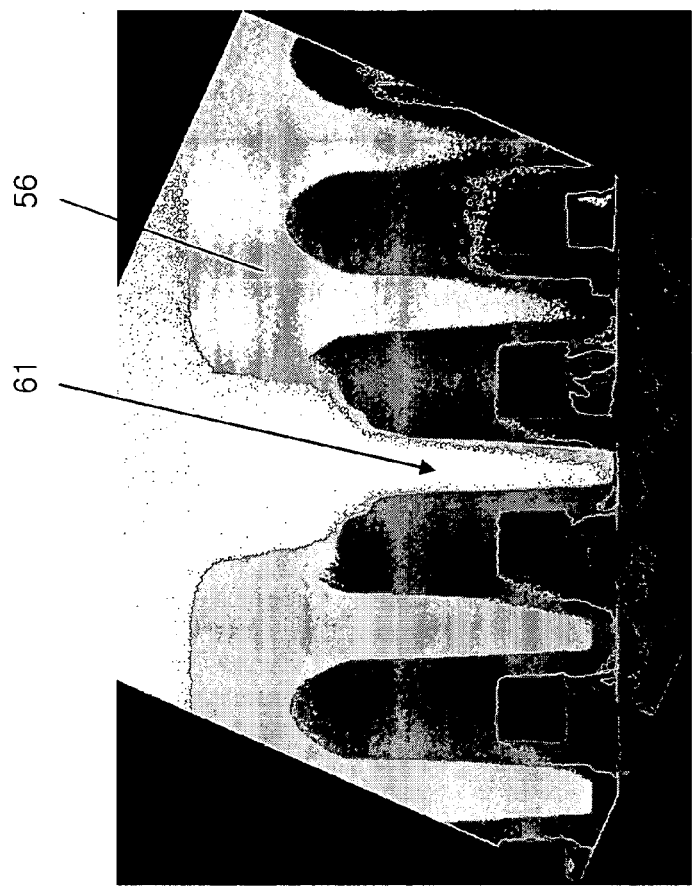
FIG. 9B is a micrograph of SEM showing a cross-sectional view of the structure containing the exposed substrate in the direction of the line C–C' shown in FIG. 9A.
Figure 9A:
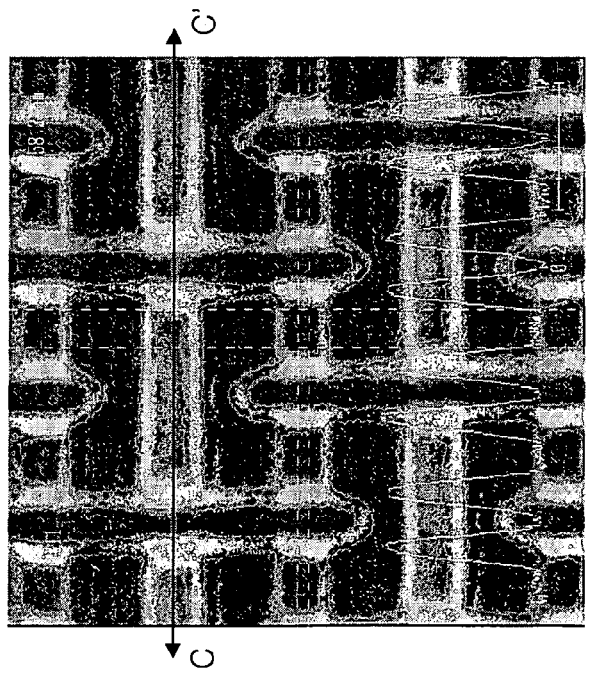
FIG. 9A is a micrograph of SEM showing a top view of a structure containing an exposed substrate after an etch stop layer is removed.

FIG. 9A is a micrograph of SEM showing a top view of the structure containing an exposed substrate 50 after the removal of the etch stop layer 55. FIG. 9B is a micrograph of SEM showing a cross-sectional view of the above structure in the direction of the line C–C' shown in FIG. 9A.

Referring to FIGS. 9A and 9B, the contact-not-open phenomenon does not shown at the bottom area of the contact hole 61, and the total loss of the gate hard mask 53 from the SAC etching process and the etching of the etch stop layer is less than about 600 Å.

Figure 10C:
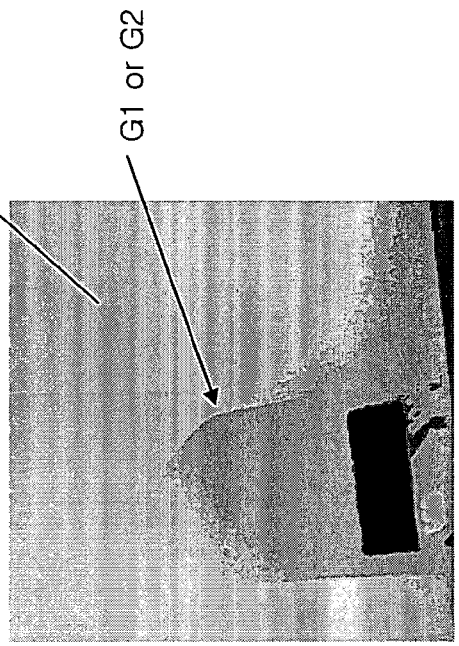
FIG. 10C is a micrograph of SEM showing a cross-sectional view of a peripheral circuit region in which the hard mask remains after the formation of the plug 63 shown in FIG. 10B.
Figure 10B:
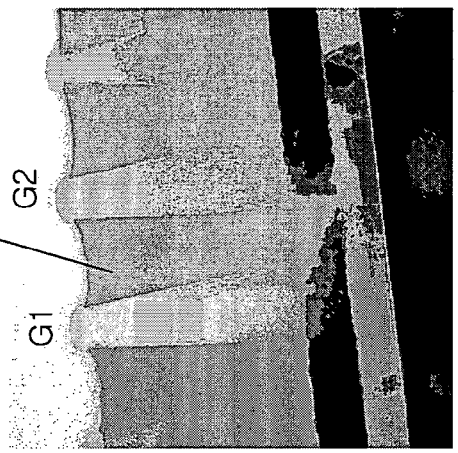
FIG. 10B is a micrograph of SEM showing a cross-sectional view of the plugs formed between gate electrode patterns in a cell region.
Figure 10A:
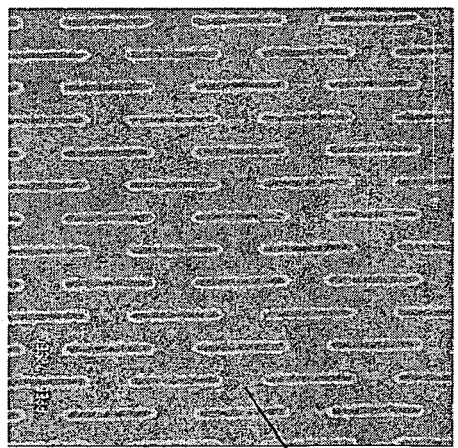
FIG. 10A is a micrograph of SEM showing a top view of plugs formed in accordance with the preferred embodiment of the present invention.

FIG. 10A is a top view of the plugs 63. FIG. 10B is a cross-sectional view of the plugs 63 formed between the gate electrode patterns G1 and G2 in the cell region. FIG. 10C is a cross-sectional view showing the peripheral circuit region in which the hard mask 57A remains after the formation of the plugs 63 by using the cell open mask during the removal of the etch stop layer 55.

Referring to FIG. 10B, there is no seam generated. Also, referring to FIG. 10C, the gate electrode pattern G1 or G2 is not attacked during the CMP process for isolating the plugs 63 because of the partially remaining portion of the hard mask 57A.

On the basis of the preferred embodiment of the present invention, the decreased thickness of the photoresist pattern by using the thin hard mask nitride layer makes it possible to secure process margins for the photolithography, so that ultra fine patterns can be easily realized along with the extended CD of the bottom area of the contact hole and improvement on the pattern collapsing phenomenon.

Also, since the hard mask is made of nitride, it is possible to perform a series of processes such as the hard mask pattern formation process, the SAC etching process and the etch stop layer etching and removing process at the same chamber for use in the oxide layer under the in situ condition.

According to the preferred embodiment of the present invention, the hard mask is used as the mask pattern in the SAC etching process, and this fact makes it possible to employ the SAC etching process conditions providing high etch selectivity with respect to the inter-layer insulation layer 56 to thereby minimize the loss of the gate hard mask.

As a result of the reduced loss of the gate hard mask, the capping process is not necessary, and this omission of the capping process contributes to the simplified steps of the landing plug contact process and solves the problem of contact-not-open phenomenon occurring due to the capping layer.

The use of the nitride-based hard mask also improves an etch profile of the inter-layer insulation layer, and thereby suppressing the seam generations.

Furthermore, because nitride having an insulating property is used as the hard mask material, the hard mask can be used in the plug formation process and the SEG technique, and thereby further being applicable to a sub 80 nm technology.

Additionally, the hard mask remaining in the peripheral circuit region blocks the gate electrode patterns in the peripheral circuit region from being attacked during the CMP process.

Although the preferred embodiment of the present invention exemplifies the application of the SAC etching process to the line type mask pattern, it is still possible to apply the SAC etching process to a hole type mask pattern. Also, in addition to the opening of the contact hole disposed between the gate electrodes, the present invention can be applied to other various opening process such as a storage node contact hole formation process and a via contact formation process.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
    (a) forming a semiconductor substrate structure including a substrate, a plurality of conductive patterns, an etch stop layer, an inter-layer insulation layer, a nitride on top the inter-layer insulation layer for forming a hard mask, an anti-reflective coating (ARC) layer and a photoresist pattern;
    (b) selectively etching the ARC layer and the nitride layer with use of the photoresist pattern as a first etch mask;
    (c) removing the photoresist pattern and the ARC layer;
    (d) etching the inter-layer insulation layer disposed between the conductive patterns by using the hard mask as an etch mask to form a contact hole exposing the etch stop layer;
    (e) removing the etch stop layer formed at a bottom area of the contact hole to expose the substrate; and
    (f) forming a plug electrically contacted to the exposed substrate, wherein the steps (b) and (d) to (e) proceeds in an in situ condition.

2. The method as recited in claim 1, wherein each of the conductive patterns has a stack structure including a hard mask insulation layer and a conductive layer.

3. The method as recited in claim 1, wherein at the step (e), the etch stop layer is removed by employing a blanket etching process or a cell open mask.

4. The method as recited in claim 2, wherein the nitride layer is deposited with a predetermined thickness equal to or greater than the total thickness of lost portions of the hard mask insulation layer during the step (d) and the step (e).

5. The method as recited in claim 1, wherein at the step (e), the hard mask is simultaneously removed.

6. The method as recited in claim 1, wherein the inter-layer insulation layer is made of an oxide-based material and is etched by performing a self-aligned contact (SAC) etching process.

7. The method as recited in claim 6, wherein the SAC etching process proceeds by employing an etch gas such as $C_4F_6$ and $C_5F_8$.

8. The method as recited in claim 1, wherein the step (a) includes the steps of:
- depositing the nitride layer on the substrate on which the plurality of conductive patterns, the etch stop layer and the inter-layer insulation layer are sequentially formed, the substrate classified into a cell region and a peripheral circuit region;
- forming the anti-reflective coating (ARC) layer on the nitride layer; and
- forming the photoresist pattern on the ARC layer through an ArF photolithography.

9. The method as recited in claim 1, wherein the step (f) includes the steps of:
- forming a conductive material for forming the plug to make an electric contact to the exposed substrate;
- performing an etch-back process to remove a partial portion of the conductive material to diminish a height difference between the cell region and the peripheral circuit region; and
- performing a chemical mechanical polishing process to the conductive material until an upper part of each conductive pattern is exposed.

10. The method as recited in claim 9, wherein the step of forming the conductive material for forming the plug proceeds by depositing the conductive material on an entire surface of the substrate or growing the conductive material from the exposed substrate through a selective epitaxial growth (SEG) technique.

11. The method as recited in claim 1, wherein the photoresist pattern is formed in a line type or a hole type.

12. The method as recited in 1, wherein the conductive pattern is one of a gate electrode pattern, a bit line and a metal wire.

13. A method for fabricating a semiconductor device, comprising the steps of:
- (a) forming a semiconductor substrate structure including a substrate, a nitride layer on top of the inter-layer insulation layer for forming a hard mask, a plurality of conductive patterns, an etch stop layer, an inter-layer insulation layer, an anti-reflective coating (ARC) layer and a photoresist pattern;
- (b) loading the resulting semiconductor substrate structure into an etching equipment having at least two chambers;
- (c) selectively etching the ARC layer and the nitride layer with use of the photoresist pattern as a first etch mask;
- (d) removing the photoresist pattern and the ARC layer;
- (e) etching the inter-layer insulation layer disposed between the conductive patterns by using the hard mask as a second etch mask to form a contact hole exposing the etch stop layer;
- (f) removing the etch stop layer formed at a bottom area of the contact hole to expose the substrate; and
- (g) forming a plug electrically contacted to the exposed substrate, wherein the steps (c) and (e) to (f) proceeds in an in situ condition.

14. The method as recited in claim 13, wherein the steps (c) and (d) are performed at a first chamber and the steps (e) and (f) are performed at a second chamber.

15. The method as recited in claim 13, wherein each of the conductive pattern has a stack structure including a hard mask insulation layer and a conductive layer.

16. The method as recited in claim 13, wherein at the step (f), the etch stop layer is removed by employing a blanket etching process or a cell open mask.

17. The method as recited in claim 15, wherein the nitride layer is deposited with a predetermined thickness equal to or greater than the total thickness of lost portions of the hard mask insulation layer during the step (e) and the step (f).

18. The method as recited in claim 13, wherein at the step (f), the hard mask is simultaneously removed.

19. The method as recited in claim 13, wherein the inter-layer insulation layer is made of an oxide-based material and is etched by performing a SAC etching process.

20. The method as recited in claim 19, wherein the SAC etching process proceeds by employing an etch gas such as $C_4F_6$ and $C_5F_8$.

21. The method as recited in claim 13, wherein the step (a) includes the steps of:
- depositing the nitride layer on the substrate on which the plurality of conductive patterns, the etch stop layer and the inter-layer insulation layer are sequentially formed, the substrate classified into a cell region and a peripheral circuit region;
- forming the anti-reflective coating (ARC) layer on the nitride layer; and
- forming the photoresist pattern on the ARC layer through an ArF photolithography.

22. The method as recited in claim 13, wherein the step (g) includes the steps of:
- forming a conductive material for forming the plug to make an electric contact to the exposed substrate;
- performing an etch-back process to remove a partial portion of the conductive material to diminish a height difference between the cell region and the peripheral circuit region; and
- performing a chemical mechanical polishing process to the conductive material until an upper part of each conductive pattern is exposed.

23. The method as recited in claim 22, wherein the step of forming the conductive material for forming the plug proceeds by depositing the conductive material on an entire surface of the substrate or growing the conductive material from the exposed substrate through a SEG technique.

24. The method as recited in claim 13, wherein the photoresist pattern is formed in a line type or a hole type.

25. The method as recited in 13, each of the conductive patterns is one of a gate electrode pattern, a bit line and a metal wire.

* * * * *

UNITED STATES PATENT AND TRADEMARK OFFICE
CERTIFICATE OF CORRECTION

| | |
|---|---|
| PATENT NO. | : 7,074,722 B2 |
| APPLICATION NO. | : 10/748613 |
| DATED | : July 11, 2006 |
| INVENTOR(S) | : Lee et al. |

It is certified that error appears in the above-identified patent and that said Letters Patent is hereby corrected as shown below:

Col. 16, line 5;
In Claim #15, Line 2, please delete "pattern" and insert -- patterns -- .

Signed and Sealed this

Twenty-seventh Day of March, 2007

JON W. DUDAS
*Director of the United States Patent and Trademark Office*